United States Patent
Wang et al.

(10) Patent No.: US 10,302,718 B2
(45) Date of Patent: May 28, 2019

(54) SWITCHING AMPLIFIRER AND METHOD FOR OPERATING SAME

(71) Applicant: General Electric Company, Schenectady, NY (US)

(72) Inventors: Ruxi Wang, Niskayuna, NY (US); Juan Sabate, Niskayuna, NY (US); Song Chi, Niskayuna, NY (US); Ying Mei, Shanghai (CN)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 91 days.

(21) Appl. No.: 15/523,162

(22) PCT Filed: Oct. 27, 2015

(86) PCT No.: PCT/US2015/057509
§ 371 (c)(1),
(2) Date: Apr. 28, 2017

(87) PCT Pub. No.: WO2016/069555
PCT Pub. Date: May 6, 2016

(65) Prior Publication Data
US 2017/0322269 A1  Nov. 9, 2017

(30) Foreign Application Priority Data
Oct. 28, 2014  (CN) .......................... 2014 1 0587975

(51) Int. Cl.
*G01R 33/54* (2006.01)
*H03F 3/217* (2006.01)
*G01R 33/385* (2006.01)

(52) U.S. Cl.
CPC ....... *G01R 33/3852* (2013.01); *G01R 33/543* (2013.01); *H03F 3/217* (2013.01); *H03F 2200/372* (2013.01)

(58) Field of Classification Search
CPC ... G01R 33/3852; G01R 33/543; H03F 3/217; H03F 2200/372
See application file for complete search history.

(56) References Cited

U.S. PATENT DOCUMENTS 5,914,638 A    6/1999   He
5,949,668 A *  9/1999   Schweighofer .... G01R 33/3852
                                                 363/136

(Continued)

FOREIGN PATENT DOCUMENTS

CN        103176150 A    6/2013

OTHER PUBLICATIONS

International Search Report and Written Opinion for International Application No. PCT/US2015/057509, dated Feb. 16, 2016, 3 pages.

(Continued)

*Primary Examiner* — Rodney A Bonnette

(57) ABSTRACT

A method is used for operating a switching amplifier, the switching amplifier includes a plurality of cascade elements. The method includes: coupling the cascade elements in series between two terminals of a load; providing two leg circuits each comprised of switches in each of the cascade elements; and controlling all of the switches comprised in the switching amplifier using space vector modulation (SVM), such that a change of a common mode (CM) voltage generated by the switching amplifier is in a predetermined range.

20 Claims, 9 Drawing Sheets

(56) References Cited

U.S. PATENT DOCUMENTS

| | | | |
|---|---|---|---|
| 7,738,267 B1 | 6/2010 | Tallam et al. | |
| 7,932,777 B1 * | 4/2011 | Zipfel, Jr. et al. | |
| 10,036,789 B2 * | 7/2018 | Yu | G01R 33/385 |
| 2008/0298103 A1 | 12/2008 | Bendre et al. | |
| 2010/0164621 A1 | 7/2010 | Srinivasan et al. | |
| 2010/0172162 A1 | 7/2010 | Tallam et al. | |
| 2012/0007571 A1 * | 1/2012 | Huisman | G01R 33/3852 323/271 |
| 2012/0249145 A1 * | 10/2012 | Lai | G01R 33/3852 324/318 |
| 2013/0162250 A1 * | 6/2013 | Sabate | G01R 33/3852 324/309 |
| 2017/0363698 A1 * | 12/2017 | Lin | G01R 33/3852 |
| 2018/0231623 A1 * | 8/2018 | Lin | H02M 1/12 |

OTHER PUBLICATIONS

Chinese OA for application No. 201410587975.9, dataed Aug. 22, 2017, 7 pages.

Loh, P. C., et al., "Reduced common-mode modulation strategies for cascaded multilevel inverters," IEEE Transactions on Industry Applications, vol. 39, Issue. 5, pp. 1386-1395 (dated Sep. 29, 2003).

Wang, R., et al., "Reduced common-mode noise modulation strategies for gradient driver with cascaded H-bridge multilevel structure," IEEE Energy Conversion Congress and Exposition, pp. 240-246 (dated Sep. 20, 2015).

Extended European Search Report and Opinion issued in connection with corresponding EP Application No. 15854701.8 dated Jun. 11, 2018, 10 pages.

* cited by examiner

SWITCHING AMPLIFIRER AND METHOD FOR OPERATING SAME

CROSS-REFERENCE TO RELATED APPLICATIONS

This is a national stage application under 35 U.S.C § 371 (c) of PCT Patent Application No. PCT/US2015/057509, filed on Oct. 27, 2015, which claims priority to China Patent Application No. 201410587975.9, filed on Oct. 28, 2014, the entirety of which is incorporated herein by reference.

BACKGROUND

Embodiments of the disclosure relate generally to switching amplifiers, and more particularly to a gradient driver that is compatible with magnetic resonance imaging (MRI) systems.

In a MRI system, gradient drivers are configured to excite gradient coils located around an object, for example a patient, to generate magnetic field gradients along X-axes direction, Y-axes direction, and Z-axes direction. Typically, the gradient driver is a switching power supply which is composed of power semiconductor devices, such as insulated gate bipolar transistors (IGBTs), power metal oxide semiconductor filed effect transistor (MOSFET), etc. In order to control an electrical power that can be transferred by the gradient driver, the power semiconductor devices are usually operated in a pulse width modulation (PWM) method.

However, the PWM method will lead to a fast voltage (dv/dt) or current (di/dt) transient which could generate a lot of high frequency harmonic contents. As mentioned above, the high frequency harmonic contents may contaminate radio frequency (RF) signals that will be sensed by RF coils, and lead to a significant degradation of the MR image quality. The high frequency harmonic contents could be defined as differential mode (DM) electromagnetic noise and common mode (CM) electromagnetic noise. Usually, the magnitude of the CM electromagnetic noise is greater than the magnitude of the DM electromagnetic noise.

Therefore, it is desired to decrease the CM electromagnetic noise generated by the gradient driver.

SUMMARY

In accordance with one or more embodiments disclosed herein, a switching amplifier is provided. The switching amplifier includes a control device and a plurality n of cascade elements coupled in series between two terminals of a load. Each of the cascade elements is substantially identical and includes two leg circuits each comprised of switches. The control device is coupled to the respective switches in the respective leg circuits in the respective cascade elements; the control device is configured to control all of the switches using space vector modulation (SVM), such that a common mode (CM) voltage generated by the switching amplifier is equal to a constant value.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

In an effort to provide a concise description of these embodiments, not all features of an actual implementation are described in the one or more specific embodiments. It should be appreciated that in the development of any such actual implementation, as in any engineering or design project, numerous implementation-specific decisions must be made to achieve the developers' specific goals, such as compliance with system-related and business-related constraints, which may vary from one implementation to another.

Unless defined otherwise, technical and scientific terms used herein have the same meaning as is commonly understood by one of ordinary skill in the art to which this disclosure belongs. The terms "first," "second," and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean either any, several, or all of the listed items. The use of "including," "comprising," or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. The terms "circuit," "circuitry," and "controller" may include either a single component or a plurality of components, which are either active and/or passive components and may be optionally connected or otherwise coupled together to provide the described function.

Figure 1:
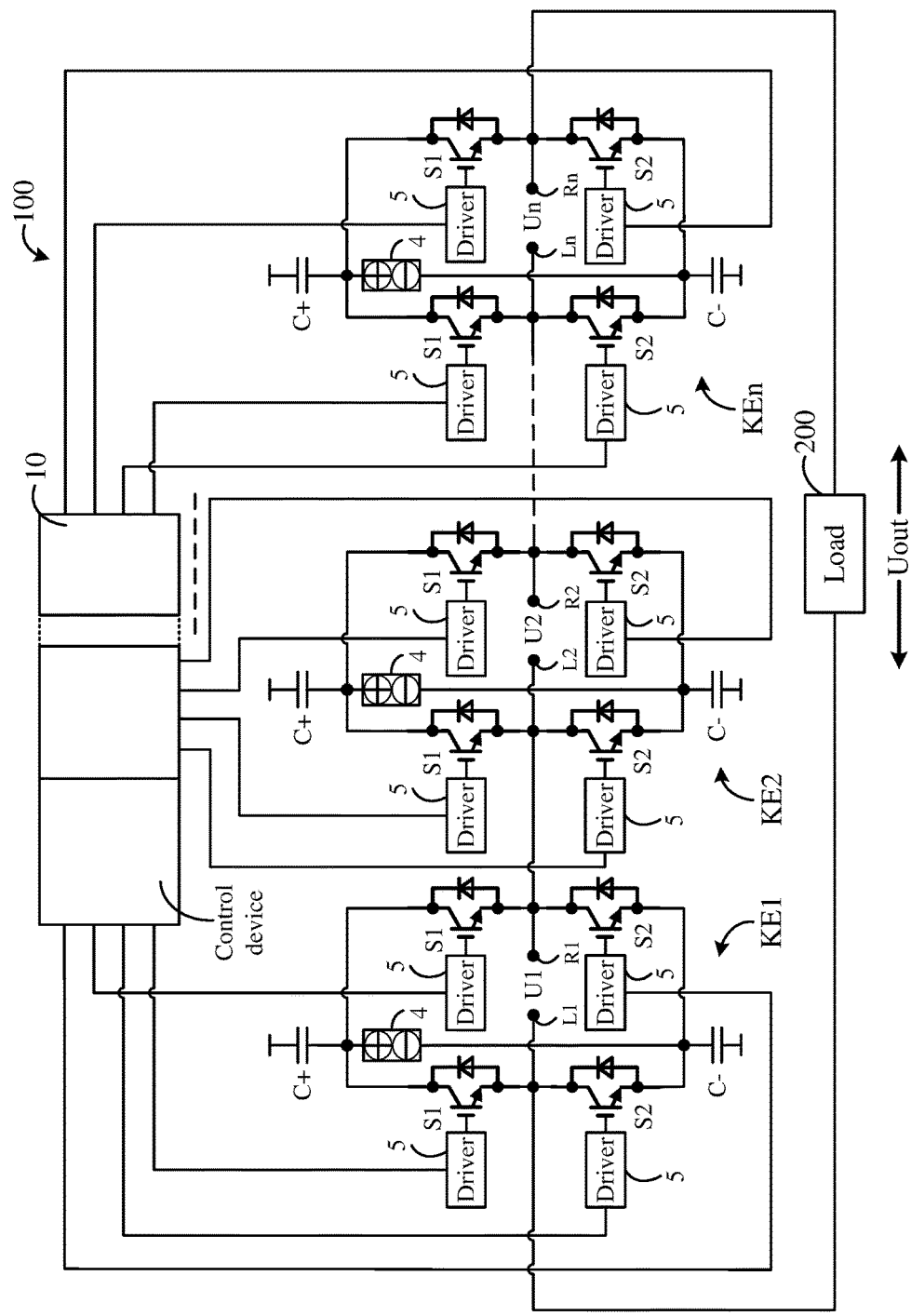
FIG. 1 is a circuit diagram of a switching amplifier in accordance with one embodiment of the present disclosure.

As an exemplary embodiment, FIG. 1 is a switching amplifier 100 that is constructed in a cascaded form. The switching amplifier 100 is configured to power a load 200. As a non-limiting example, the switching amplifier 100 is a gradient amplifier of a magnetic resonance imaging (MRI) system, and the load 200 is a gradient coil of the MRI system.

The switching amplifier 100 includes a control device 10 and a plurality n of cascade elements KE1, KE2, . . . KEn of the same type. In other embodiments, the control device 10 is not included in the switching amplifier 100. In detail, the cascade elements KE1, KE2, . . . KEn are connected in series between two terminals of the load 200. Cascade element voltages U1, U2, . . . Un are allocated to the respective cascade elements KE1, KE2, . . . KEn, their sum yields an output voltage Uout, across the load 200, of the switching amplifier 100; thus Uout=U1+U2+ . . . Un.

Each of the cascade elements KE1, KE2, . . . KEn includes two leg circuits in known fashion, at which a power source 4 is connected. Each leg circuit includes two switches S1 and S2 connected in series between two poles of the power source 4 and a leg terminal defined as a connection point between two switches S1 and S2. As a non-limiting example, two switches S1 and S2 can be IGBTs (Insulated Gate Bipolar Transistor), or power MOSFETs (Metal Oxide Semiconductor Field Effect Transistor), or BJT (Bipolar Junction Transistor), or other controllable semiconductor devices, etc. As a non-limiting example, each of the cascade element voltages U1, U2, . . . Un is defined as a voltage between two leg terminals of two corresponding leg circuits. Furthermore, the capacitances C+ and C− are exemplarily illustrated in FIG. 1 for the distributed conductor-to-ground, or coupling capacitances of the switching amplifier 100.

The structure and function of the cascade elements is described as an example for the cascade elements KE1, KE2, and KEn. The other cascade elements KE3 to KEn−1 are constructed analogously to one of the cascade elements KE1, KE2, and KEn. Taking the cascade elements KE1, KE2, and KEn as examples, the leg terminal of one leg circuit of the cascade element KE1 is labeled as L1, and the leg terminal of the other leg circuit of the cascade element KE1 is labeled as R1. Cascade element voltage U1 is calculated by formula: U1=VL1−VR1, where VL1 and VR1 are the respective potentials of the leg terminals L1 and R1.

The leg terminal of one leg circuit of the cascade element KE2 is labeled as L2, and the leg terminal of the other leg circuit of the cascade element KE2 is labeled as R2. Cascade element voltage U2 is calculated by formula: U2=VL2−VR2, where VL2 and VR2 are the respective potentials of the leg terminals L2 and R2.

The leg terminal of one leg circuit of the cascade element KEn is labeled as Ln, and the leg terminal of the other leg circuit of the cascade element KEn is labeled as Rn. Cascade element voltage Un is calculated by formula: Un=VLn−VRn, where VLn and VRn are the respective potentials of the leg terminals Ln and Rn.

Respective drivers 5 are allocated to switches S1 and S2. The drivers 5 are driven by a control device 10 that is shared by all cascade elements KE1 to KEn, and all switches are controlled by respective drivers 5 according to space vector modulation (SVM), such that the change of a common mode (CM) voltage generated by the switching amplifier 100 is in a predetermined range and a voltage across the load 200 is in a range from −nVdc to nVdc, where Vdc is a voltage of the power source 4. The CM voltage Ucm is associated with potentials of two leg terminals L1 and Rn that are connected to the load 200. In detail, the predetermined range and the SVM method will be described in FIGS. 2-9.

Because the change of the CM voltage is in the predetermined range, electromagnetic interference (EMI) generated by the CM voltage is reduced. As a specific example, the change of the CM voltage is equal to zero, therefore EMI generated by the CM voltage is further reduced.

The control device 10 is depicted as being formed from a number of modules, each module being allocated to a respective cascade element. In other embodiments, the control device 10 is constructed as a unified subassembly.

Figure 2:
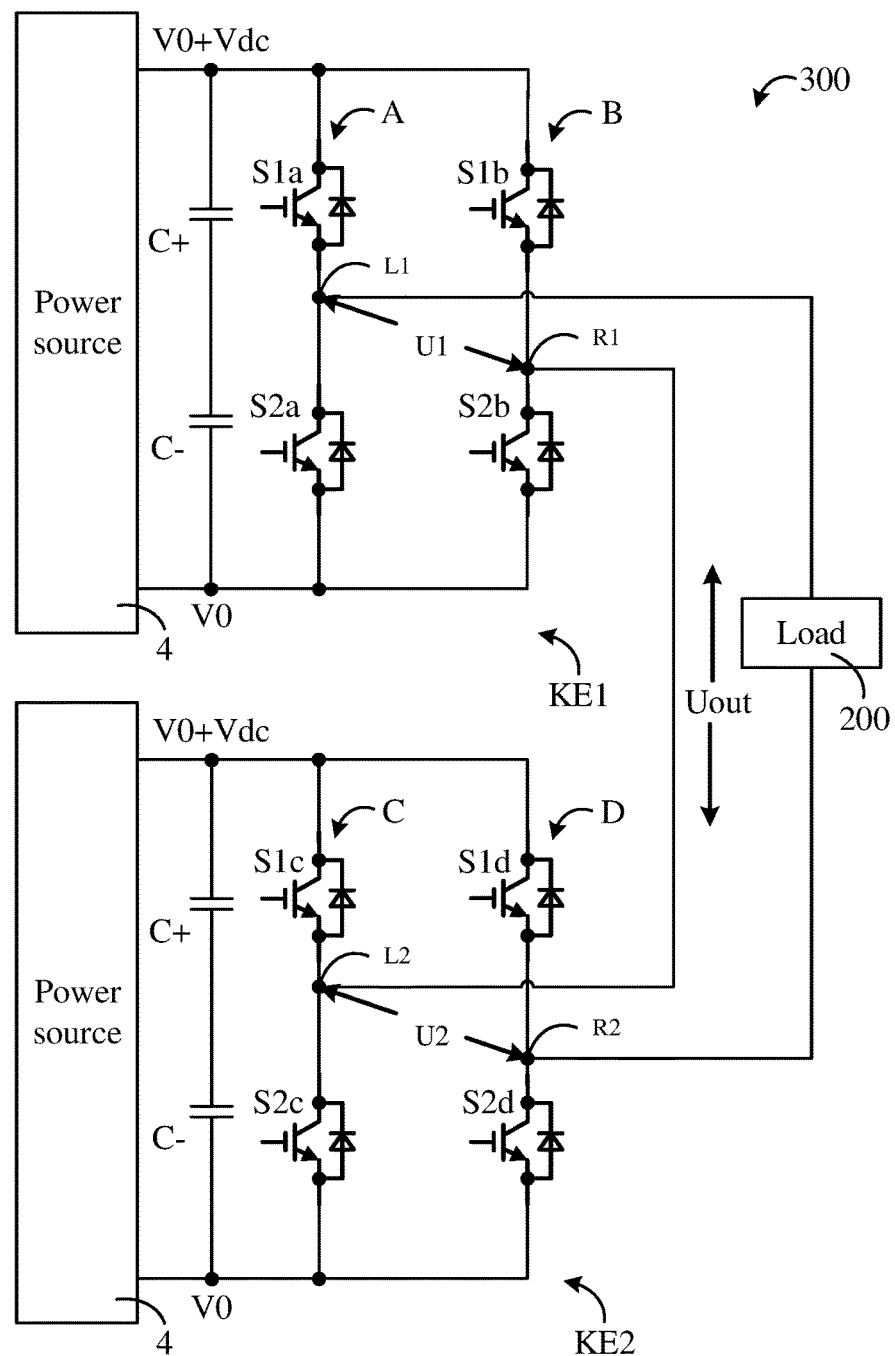
FIG. 2 is a simplified representation of FIG. 1 for the switching amplifier with two cascade elements.

Referring further to FIG. 2, a switching amplifier 300 with two cascade elements according to FIG. 1 is depicted. As a non-limiting example, the switching amplifier 300 includes two cascade elements KE1, KE2. In the embodiment, the leg circuit of each of the cascade elements KE1 and KE2 includes two switches connected in series between two poles of the power source 4.

The cascade elements KE1 includes two leg circuits A and B. Two switches of the leg circuit A are labeled as S1*a* and S2*a* respectively, two switches of the leg circuit B are labeled as S1*b* and S2*b* respectively.

The cascade elements KE2 includes two leg circuits C and D. Two switches of the leg circuit C are labeled as S1*c* and S2*c* respectively, two switches of the leg circuit D are labeled as S1*d* and S2*d* respectively.

Eight switches S1*a*, S2*a*, S1*b*, S2*b*, S1*c*, S2*c*, S1*d*, S2*d* are controlled by using one of ten vectors described in Table 1 as shown below, such that the change of the CM voltage generated by the switching amplifier 300 is in the predetermined range and the voltage across the load 200 is in a range from −2Vdc to 2Vdc.

The following Table 1 explains which switches are in the open position and the closed position to achieve space vector modulation.

TABLE 1

Voltage Vector Table

| Vector No. | Switching States | | | | | | | | Uout | Ucm |
|---|---|---|---|---|---|---|---|---|---|---|
| | S1a | S2a | S1b | S2b | S1c | S2c | S1d | S2d | | |
| 1 | OFF | ON | OFF | ON | OFF | ON | ON | OFF | −Vdc | V0 + 0.5 Vdc |
| 2 | OFF | ON | OFF | ON | ON | OFF | ON | OFF | 0 | V0 + 0.5 Vdc |
| 3 | OFF | ON | ON | OFF | OFF | ON | ON | OFF | −2 Vdc | V0 + 0.5 Vdc |
| 4 | OFF | ON | ON | OFF | ON | OFF | ON | OFF | −Vdc | V0 + 0.5 Vdc |
| 5 | ON | OFF | OFF | ON | OFF | ON | OFF | ON | Vdc | V0 + 0.5 Vdc |
| 6 | ON | OFF | OFF | ON | ON | OFF | OFF | ON | 2 Vdc | V0 + 0.5 Vdc |
| 7 | ON | OFF | ON | OFF | OFF | ON | OFF | ON | 0 | V0 + 0.5 Vdc |
| 8 | ON | OFF | ON | OFF | ON | OFF | OFF | ON | Vdc | V0 + 0.5 Vdc |
| 9 | OFF | ON | ON | OFF | ON | OFF | OFF | ON | 0 | V0 |
| 10 | OFF | ON | OFF | ON | ON | OFF | OFF | ON | Vdc | V0 |

The term "ON" means that a switch is closed or conductive. The term "OFF" means that a switch is open or non-conductive.

Vector Terminology

As shown above in the Table 1, a first vector 1 is defined as a switching state in which the eight switches S1*a*, S2*a*, S1*b*, S2*b*, S1*c*, S2*c*, S1*d*, S2*d* are OFF, ON, OFF, ON, OFF, ON, ON, OFF respectively. The eight switches S1*a*, S2*a*, S1*b*, S2*b*, S1*c*, S2*c*, S1*d*, S2*d* are controlled by using the first vector 1, such that the CM voltage is equal to V0+0.5Vdc and the voltage Uout across the load 200 is equal to −Vdc.

A second vector 2 is defined as a switching state in which the eight switches S1a, S2a, S1b, S2b, S1c, S2c, S1d, S2d are OFF, ON, OFF, ON, ON, OFF, ON, OFF respectively. The eight switches S1a, S2a, S1b, S2b, S1c, S2c, S1d, S2d are controlled by using the second vector 2, such that the CM voltage is equal to V0+0.5Vdc and the voltage Uout across the load 200 is equal to zero volts.

A third vector 3 is defined as a switching state in which the eight switches S1a, S2a, S1b, S2b, S1c, S2c, S1d, S2d are OFF, ON, ON, OFF, OFF, ON, ON, OFF respectively. The eight switches S1a, S2a, S1b, S2b, S1c, S2c, S1d, S2d are controlled by using the third vector 3, such that the CM voltage is equal to V0+0.5Vdc and the voltage Uout across the load 200 is equal to −2Vdc.

A fourth vector 4 is defined as a switching state in which the eight switches S1a, S2a, S1b, S2b, S1c, S2c, S1d, S2d are OFF, ON, ON, OFF, ON, OFF, ON, OFF respectively. The eight switches S1a, S2a, S1b, S2b, S1c, S2c, S1d, S2d are controlled by using the fourth vector 4, such that the CM voltage is equal to V0+0.5Vdc and the voltage Uout across the load 200 is equal to −Vdc.

A fifth vector 5 is defined as a switching state in which the eight switches S1a, S2a, S1b, S2b, S1c, S2c, S1d, S2d are ON, OFF, ON, OFF, ON, OFF, ON, ON respectively. The eight switches S1a, S2a, S1b, S2b, S1c, S2c, S1d, S2d are controlled by using the fifth vector 5, such that the CM voltage is equal to V0+0.5Vdc and the voltage Uout across the load 200 is equal to Vdc.

A sixth vector 6 is defined as a switching state in which the eight switches S1a, S2a, S1b, S2b, S1c, S2c, S1d, S2d are ON, OFF, OFF, ON, ON, OFF, OFF, ON respectively. The eight switches S1a, S2a, S1b, S2b, S1c, S2c, S1d, S2d are controlled by using the sixth vector 6, such that the CM voltage is equal to V0+0.5Vdc and the voltage Uout across the load 200 is equal to 2Vdc.

A seventh vector 7 is defined as a switching state in which the eight switches S1a, S2a, S1b, S2b, S1c, S2c, S1d, S2d are ON, OFF, ON, OFF, OFF, ON, OFF, ON respectively. The eight switches S1a, S2a, S1b, S2b, S1c, S2c, S1d, S2d are controlled by using the seventh vector 7, such that the CM voltage is equal to V0+0.5Vdc and the voltage Uout across the load 200 is equal to zero volts.

An eighth vector 8 is defined as a switching state in which the eight switches S1a, S2a, S1b, S2b, S1c, S2c, S1d, S2d are ON, OFF, ON, OFF, ON, OFF, OFF, ON respectively. The eight switches S1a, S2a, S1b, S2b, S1c, S2c, S1d, S2d are controlled by using the eighth vector 8, such that the CM voltage is equal to V0+0.5Vdc and the voltage Uout across the load 200 is equal to Vdc.

A ninth vector 9 is defined as a switching state in which the eight switches S1a, S2a, S1b, S2b, S1c, S2c, S1d, S2d are OFF, ON, ON, OFF, ON, OFF, OFF, ON respectively. The eight switches S1a, S2a, S1b, S2b, S1c, S2c, S1d, S2d are controlled by using the ninth vector 9, such that the CM voltage is equal to V0 and the voltage Uout across the load 200 is equal to zero.

A tenth vector 10 is defined as a switching state in which the eight switches S1a, S2a, S1b, S2b, S1c, S2c, S1d, S2d are OFF, ON, OFF, ON, ON, OFF, OFF, ON respectively. The eight switches S1a, S2a, S1b, S2b, S1c, S2c, S1d, S2d are controlled by using the tenth vector 10, such that the CM voltage is equal to V0 and the voltage Uout across the load 200 is equal to Vdc.

In the embodiment, the CM voltage is calculated by Saber or PLECS.

As a specific example, the eight switches S1a, S2a, S1b, S2b, S1c, S2c, S1d, S2d are controlled by using one of the first vector 1, the second vector 2, the third vector 3, the fourth vector 4, the fifth vector 5, the sixth vector 6, the seventh vector 7, and the eighth vector 8, such that the change of the CM voltage is equal to zero, therefore EMI generated by the CM voltage is greatly reduced.

Figure 3:
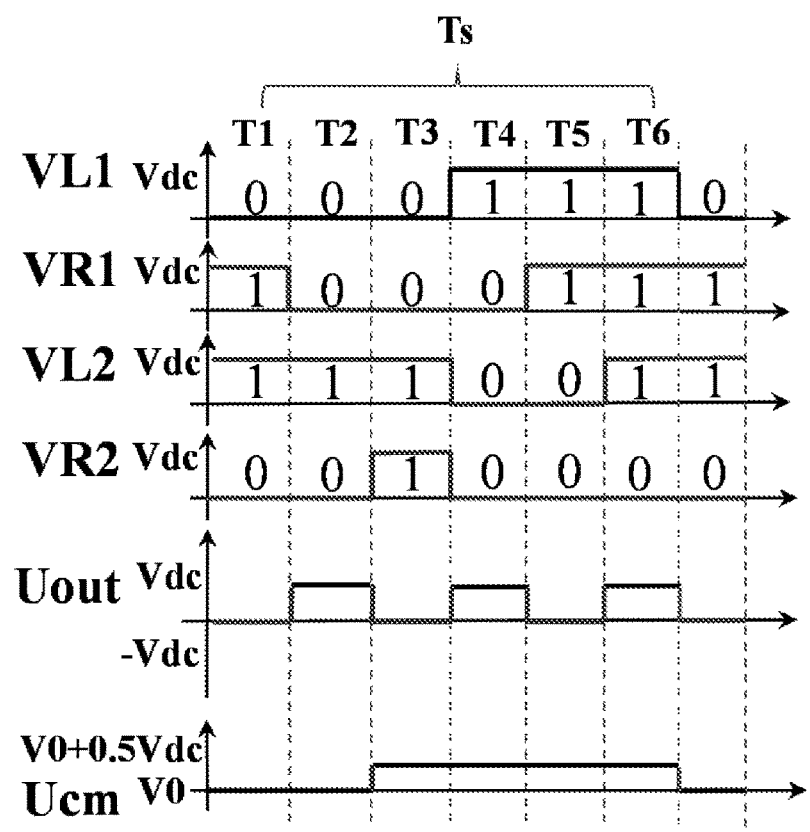
FIG. 3 shows first voltage curves for the switching amplifier of FIG. 2.

In a non-limiting embodiment, during a first switching interval T1 within a switching period Ts, the control device 10 controls the eight switches S1a, S2a, S1b, S2b, S1c, S2c, S1d, S2d using the ninth vector 9. As shown in FIG. 3, the output voltage Uout of the switching amplifier 300 is equal to zero volts, and the CM voltage Ucm is equal to V0.

During a second switching interval T2 within the switching period Ts, the control device 10 controls the eight switches S1a, S2a, S1b, S2b, S1c, S2c, S1d, S2d using the tenth vector 10. As shown in FIG. 3, the output voltage Uout of the switching amplifier 300 is equal to Vdc, and the CM voltage Ucm is equal to V0.

During a third switching interval T3 within the switching period Ts, the control device 10 controls the eight switches S1a, S2a, S1b, S2b, S1c, S2c, S1d, S2d using the second vector 2. As shown in FIG. 3, the output voltage Uout of the switching amplifier 300 is equal to zero, and the CM voltage Ucm is equal to V0+0.5Vdc.

During a fourth switching interval T4 within the switching period Ts, the control device 10 controls the eight switches S1a, S2a, S1b, S2b, S1c, S2c, S1d, S2d using the fifth vector 5. As shown in FIG. 3, the output voltage Uout of the switching amplifier 300 is equal to Vdc, and the CM voltage Ucm is equal to V0+0.5Vdc.

During a fifth switching interval T5 within the switching period Ts, the control device 10 controls the eight switches S1a, S2a, S1b, S2b, S1c, S2c, S1d, S2d using the seventh vector 7. As shown in FIG. 3, the output voltage Uout of the switching amplifier 300 is equal to zero, and the CM voltage Ucm is equal to V0+0.5Vdc.

During a sixth switching interval T6 within the switching period Ts, the control device 10 controls the eight switches S1a, S2a, S1b, S2b, S1c, S2c, S1d, S2d using the eighth vector 8. As shown in FIG. 3, the output voltage Uout of the switching amplifier 300 is equal to Vdc, and the CM voltage Ucm is equal to V0+0.5Vdc. Because the change of the CM voltage Ucm is in the predetermined range from −0.5Vdc to 0.5Vdc during the switching period Ts, the EMI generated by the CM voltage is reduced.

Eight Switches Controlled to be in One of a 1st, 2nd, 3rd, and 4th Mode

In a first embodiment, the control device 10 is configured to control the eight switches S1a, S2a, S1b, S2b, S1c, S2c, S1d, S2d to be in one of a first mode, a second mode, a third mode, and a fourth mode according to a ratio of a load output reference voltage to a voltage of the power source 4, such that the change of the CM voltage is equal to zero. As a non-limiting example, m=Vref/2Vdc, where m is the ratio, Vref is the load output reference voltage.

First Mode

Figure 4:
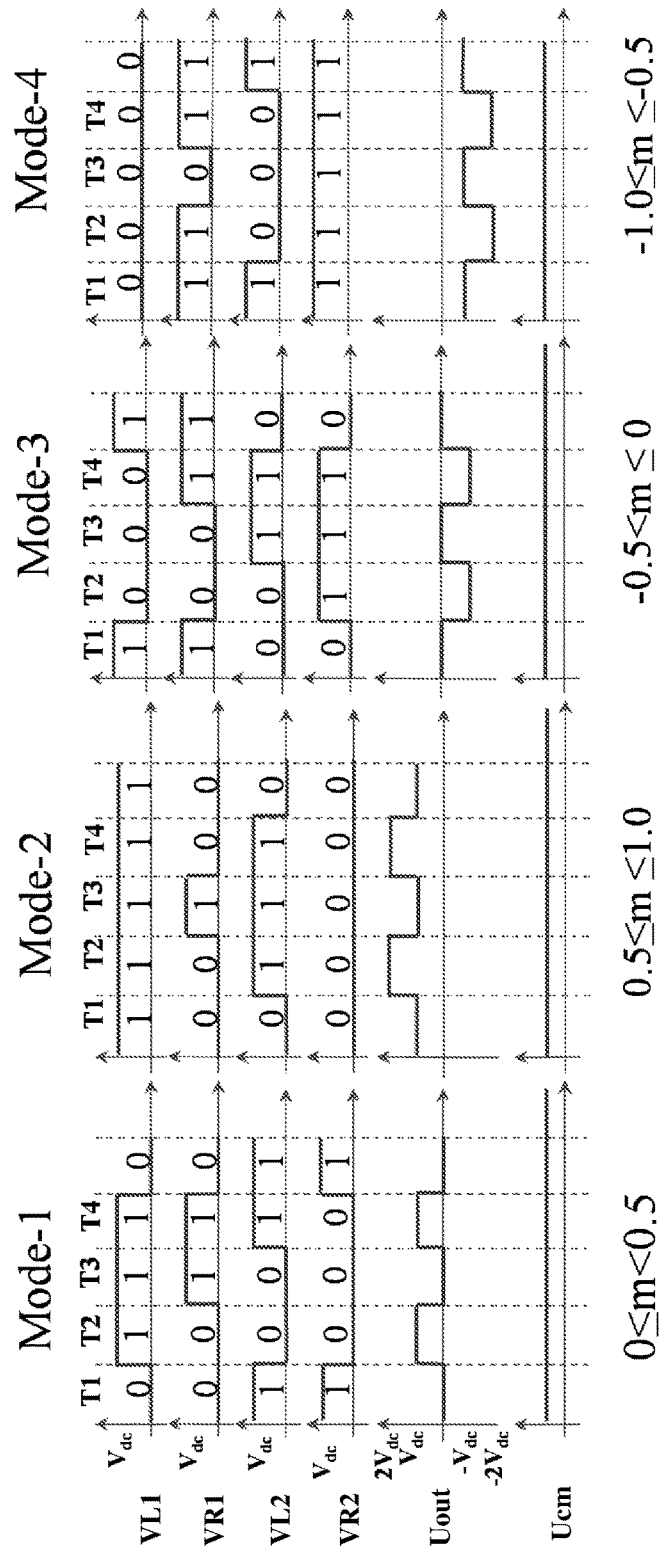
FIG. 4 shows second voltage curves for the switching amplifier of FIG. 2.

If $0 \leq m < 0.5$, the control device 10 determines that the eight switches S1a, S2a, S1b, S2b, S1c, S2c, S1d, S2d are in the first mode. During a first switching interval T1 within a switching period of the first mode, the control device 10 controls the eight switches S1a, S2a, S1b, S2b, S1c, S2c, S1d, S2d using the second vector 2. As shown in FIG. 4, the output voltage Uout of the switching amplifier 300 is equal to zero volts, and the CM voltage Ucm is equal to V0+0.5Vdc. As one non-limiting example, V0 is equal to zero volts, Ucm=V0+0.5Vdc=0.5Vdc. As another non-limiting example, V0 is equal to −0.5Vdc, Ucm=−0.5Vdc+0.5Vdc=0 volts.

During a second switching interval T2 within a switching period of the first mode, the control device 10 controls the eight switches S1a, S2a, S1b, S2b, S1c, S2c, S1d, S2d using the fifth vector 5. As shown in FIG. 4, the output voltage Uout of the switching amplifier 300 is equal to Vdc, and the CM voltage Ucm is equal to V0+0.5Vdc.

During a third switching interval T3 within a switching period of the first mode, the control device 10 controls the eight switches S1a, S2a, S1b, S2b, S1c, S2c, S1d, S2d using the seventh vector 7. As shown in FIG. 4, the output voltage Uout of the switching amplifier 300 is equal to zero volts, and the CM voltage Ucm is equal to V0+0.5Vdc.

During a fourth switching interval T4 within a switching period of the first mode, the control device 10 controls the eight switches S1a, S2a, S1b, S2b, S1c, S2c, S1d, S2d using the eighth vector 8. As shown in FIG. 4, the output voltage Uout of the switching amplifier 300 is equal to Vdc, and the CM voltage Ucm is equal to V0+0.5Vdc. Because the change of the CM voltage Ucm is equal to zero during the first mode, the EMI generated by the CM voltage is greatly reduced.

Second Mode

If $0.5 \leq m \leq 1.0$, the control device 10 determines that the eight switches S1a, S2a, S1b, S2b, S1c, S2c, S1d, S2d are in the second mode. During a first switching interval T1 within a switching period of the second mode, the control device 10 controls the eight switches S1a, S2a, S1b, S2b, S1c, S2c, S1d, S2d using the fifth vector 5. As shown in FIG. 4, the output voltage Uout of the switching amplifier 300 is equal to Vdc, and the CM voltage Ucm is equal to V0+0.5Vdc.

During a second switching interval T2 within a switching period of the second mode, the control device 10 controls the eight switches S1a, S2a, S1b, S2b, S1c, S2c, S1d, S2d using the sixth vector 6. As shown in FIG. 4, the output voltage Uout of the switching amplifier 300 is equal to 2Vdc, and the CM voltage Ucm is equal to V0+0.5Vdc.

During a third switching interval T3 within a switching period of the second mode, the control device 10 controls the eight switches S1a, S2a, S1b, S2b, S1c, S2c, S1d, S2d using the eighth vector 8. As shown in FIG. 4, the output voltage Uout of the switching amplifier 300 is equal to Vdc, and the CM voltage Ucm is equal to V0+0.5Vdc.

During a fourth switching interval T4 within a switching period of the second mode, the control device 10 controls the eight switches S1a, S2a, S1b, S2b, S1c, S2c, S1d, S2d using the sixth vector 6. As shown in FIG. 4, the output voltage Uout of the switching amplifier 300 is equal to 2Vdc, and the CM voltage Ucm is equal to V0+0.5Vdc. Because the change of the CM voltage Ucm is equal to zero during the second mode, the EMI generated by the CM voltage is greatly reduced.

Third Mode

If $-0.5 < m \leq 0$, the control device 10 determines that the eight switches S1a, S2a, S1b, S2b, S1c, S2c, S1d, S2d are in the third mode. During a first switching interval T1 within a switching period of the third mode, the control device 10 controls the eight switches S1a, S2a, S1b, S2b, S1c, S2c, S1d, S2d using the seventh vector 7. As shown in FIG. 4, the output voltage Uout of the switching amplifier 300 is equal to zero volts, and the CM voltage Ucm is equal to V0+0.5Vdc.

During a second switching interval T2 within a switching period of the third mode, the control device 10 controls the eight switches S1a, S2a, S1b, S2b, S1c, S2c, S1d, S2d using the first vector 1. As shown in FIG. 4, the output voltage Uout of the switching amplifier 300 is equal to −Vdc, and the CM voltage Ucm is equal to V0+0.5Vdc.

During a third switching interval T3 within a switching period of the third mode, the control device 10 controls the eight switches S1a, S2a, S1b, S2b, S1c, S2c, S1d, S2d using the second vector 2. As shown in FIG. 4, the output voltage Uout of the switching amplifier 300 is equal to zero volts, and the CM voltage Ucm is equal to V0+0.5Vdc.

During a fourth switching interval T4 within a switching period of the third mode, the control device 10 controls the eight switches S1a, S2a, S1b, S2b, S1c, S2c, S1d, S2d using the fourth vector 4. As shown in FIG. 4, the output voltage Uout of the switching amplifier 300 is equal to −Vdc, and the CM voltage Ucm is equal to V0+0.5Vdc. Because the change of the CM voltage Ucm is equal to zero during the third mode, the EMI generated by the CM voltage is greatly reduced.

Fourth Mode

If $-1.0 \leq m \leq -0.5$, the control device 10 determines that the eight switches S1a, S2a, S1b, S2b, S1c, S2c, S1d, S2d are in the fourth mode. During a first switching interval T1 within a switching period of the fourth mode, the control device 10 controls the eight switches S1a, S2a, S1b, S2b, S1c, S2c, S1d, S2d using the fourth vector 4. As shown in FIG. 4, the output voltage Uout of the switching amplifier 300 is equal to −Vdc, and the CM voltage Ucm is equal to V0+0.5Vdc.

During a second switching interval T2 within a switching period of the fourth mode, the control device 10 controls the eight switches S1a, S2a, S1b, S2b, S1c, S2c, S1d, S2d using the third vector 3. As shown in FIG. 4, the output voltage Uout of the switching amplifier 300 is equal to −2Vdc, and the CM voltage Ucm is equal to V0+0.5Vdc.

During a third switching interval T3 within a switching period of the fourth mode, the control device 10 controls the eight switches S1a, S2a, S1b, S2b, S1c, S2c, S1d, S2d using the first vector 1. As shown in FIG. 4, the output voltage Uout of the switching amplifier 300 is equal to −Vdc, and the CM voltage Ucm is equal to V0+0.5Vdc.

During a fourth switching interval T4 within a switching period of the fourth mode, the control device 10 controls the eight switches S1a, S2a, S1b, S2b, S1c, S2c, S1d, S2d using the third vector 3. As shown in FIG. 4, the output voltage Uout of the switching amplifier 300 is equal to −2Vdc, and the CM voltage Ucm is equal to V0+0.5Vdc. Because the change of the CM voltage Ucm is equal to zero during the fourth mode, the EMI generated by the CM voltage is greatly reduced.

Eight Switches Controlled to be in One of First Mode and Second Mode

In a second embodiment, the eight switches S1a, S2a, S1b, S2b, S1c, S2c, S1d, S2d are controlled to be in one of a first mode and a second mode according to a ratio of a load output reference voltage to a voltage of the power source 4, such that the change of the CM voltage is equal to zero. As a non-limiting example, m=Vref/2Vdc, where m is the ratio, Vref is the load output reference voltage, Vdc is the voltage of the power source 4.

Figure 5:
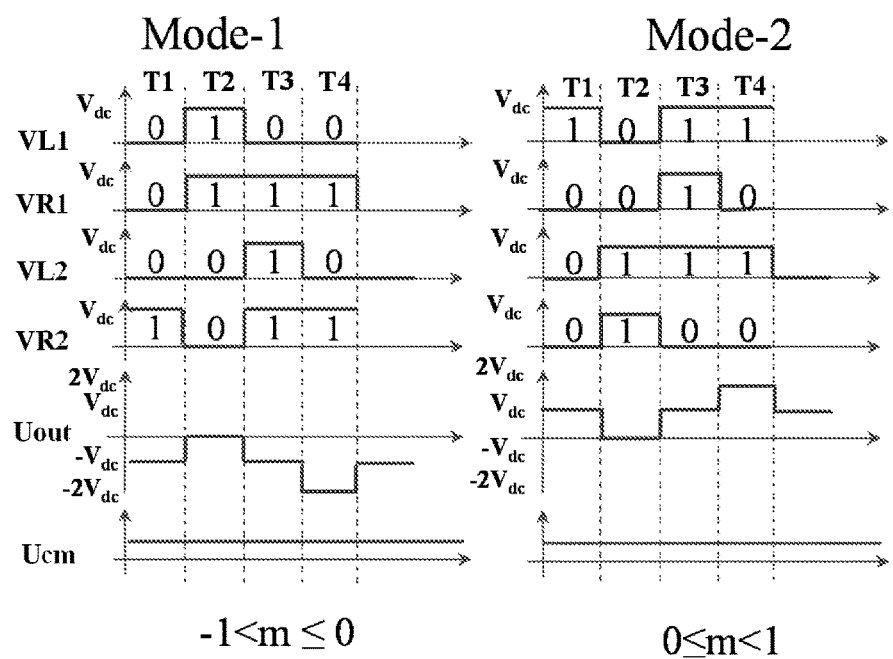
FIG. 5 shows third voltage curves for the switching amplifier of FIG. 2.

If $-1 < m \leq 0$, the control device 10 determines that the eight switches S1a, S2a, S1b, S2b, S1c, S2c, S1d, S2d are in the first mode. During a first switching interval T1 within a switching period of the first mode, the control device 10 controls the eight switches S1a, S2a, S1b, S2b, S1c, S2c, S1d, S2d using the first vector 1. As shown in FIG. 5, the output voltage Uout of the switching amplifier 300 is equal to −Vdc, and the CM voltage Ucm is equal to V0+0.5Vdc.

During a second switching interval T2 within a switching period of the first mode, the control device 10 controls the eight switches S1a, S2a, S1b, S2b, S1c, S2c, S1d, S2d using the seventh vector 7. As shown in FIG. 5, the output voltage Uout of the switching amplifier 300 is equal to zero volts, and the CM voltage Ucm is equal to V0+0.5Vdc.

During a third switching interval T3 within a switching period of the first mode, the control device 10 controls the eight switches S1a, S2a, S1b, S2b, S1c, S2c, S1d, S2d using the fourth vector 4. As shown in FIG. 5, the output voltage Uout of the switching amplifier 300 is equal to −Vdc, and the CM voltage Ucm is equal to V0+0.5Vdc.

During a fourth switching interval T4 within a switching period of the first mode, the control device 10 controls the eight switches S1a, S2a, S1b, S2b, S1c, S2c, S1d, S2d using the third vector 3. As shown in FIG. 5, the output voltage Uout of the switching amplifier 300 is equal to −2Vdc, and the CM voltage Ucm is equal to V0+0.5Vdc. Because the change of the CM voltage Ucm is equal to zero during the first mode, the EMI generated by the CM voltage is greatly reduced.

If 0≤m<1, the control device 10 determines that the eight switches S1a, S2a, S1b, S2b, S1c, S2c, S1d, S2d are in the second mode. During a first switching interval T1 within a switching period of the second mode, the control device 10 controls the eight switches S1a, S2a, S1b, S2b, S1c, S2c, S1d, S2d using the fifth vector 5. As shown in FIG. 5, the output voltage Uout of the switching amplifier 300 is equal to Vdc, and the CM voltage Ucm is equal to V0+0.5Vdc.

During a second switching interval T2 within a switching period of the second mode, the control device 10 controls the eight switches S1a, S2a, S1b, S2b, S1c, S2c, S1d, S2d using the second vector 2. As shown in FIG. 5, the output voltage Uout of the switching amplifier 300 is equal to zero volts, and the CM voltage Ucm is equal to V0+0.5Vdc.

During a third switching interval T3 within a switching period of the second mode, the control device 10 controls the eight switches S1a, S2a, S1b, S2b, S1c, S2c, S1d, S2d using the eighth vector 8. As shown in FIG. 5, the output voltage Uout of the switching amplifier 300 is equal to Vdc, and the CM voltage Ucm is equal to V0+0.5Vdc.

During a fourth switching interval T4 within a switching period of the second mode, the control device 10 controls the eight switches S1a, S2a, S1b, S2b, S1c, S2c, S1d, S2d using the sixth vector 6. As shown in FIG. 5, the output voltage Uout of the switching amplifier 300 is equal to 2Vdc, and the CM voltage Ucm is equal to V0+0.5Vdc. Because the change of the CM voltage Ucm is equal to zero during the second mode, the EMI generated by the CM voltage is greatly reduced.

Eight Switches Controlled to be in a Desired Mode

In a third embodiment, the eight switches S1a, S2a, S1b, S2b, S1c, S2c, S1d, S2d are controlled to be in a desired mode according to a ratio of a load output reference voltage to a voltage of the power source 4, such that the change of the CM voltage is equal to zero. The load output reference voltage utilized in the desired mode is different from the load out reference voltage utilized in one of the first mode, the second mode, the third mode, and the fourth mode. As a non-limiting example, m=Vref/2Vdc, where m is the ratio, Vref is the load output reference voltage utilized in the desired mode, Vdc is the voltage of the power source 4.

Desired Mode

Figure 6:
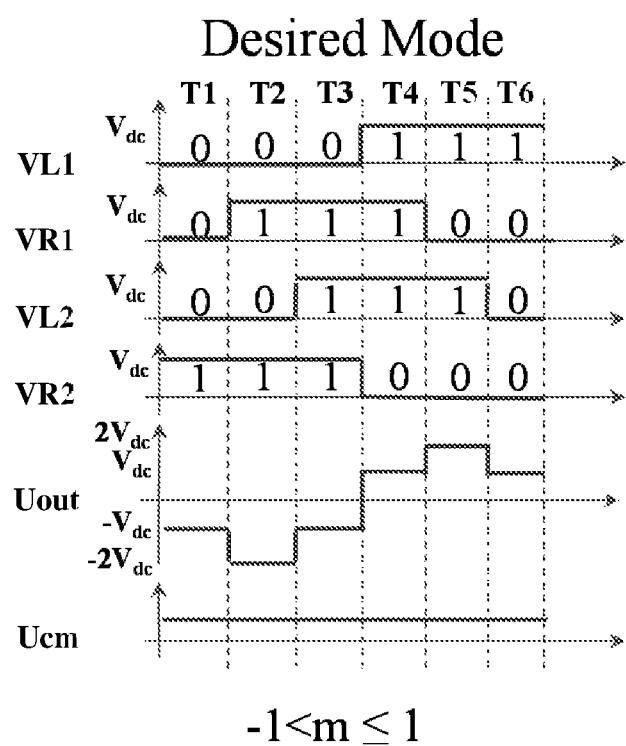
FIG. 6 shows fourth voltage curves for the switching amplifier of FIG. 2.

If −1<m≤1, the control device 10 determines that the eight switches S1a, S2a, S1b, S2b, S1c, S2c, S1d, S2d are in the desired mode. During a first switching interval T1 within a switching period of the desired mode, the control device 10 controls the eight switches S1a, S2a, S1b, S2b, S1c, S2c, S1d, S2d using the first vector 1. As shown in FIG. 6, the output voltage Uout of the switching amplifier 300 is equal to −Vdc, and the CM voltage Ucm is equal to V0+0.5Vdc.

During a second switching interval T2 within a switching period of the desired mode, the control device 10 controls the eight switches S1a, S2a, S1b, S2b, S1c, S2c, S1d, S2d using the third vector 3. As shown in FIG. 6, the output voltage Uout of the switching amplifier 300 is equal to −2Vdc, and the CM voltage Ucm is equal to V0+0.5Vdc.

During a third switching interval T3 within a switching period of the desired mode, the control device 10 controls the eight switches S1a, S2a, S1b, S2b, S1c, S2c, S1d, S2d using the fourth vector 4. As shown in FIG. 6, the output voltage Uout of the switching amplifier 300 is equal to −Vdc, and the CM voltage Ucm is equal to V0+0.5Vdc.

During a fourth switching interval T4 within a switching period of the desired mode, the control device 10 controls the eight switches S1a, S2a, S1b, S2b, S1c, S2c, S1d, S2d using the eighth vector 8. As shown in FIG. 6, the output voltage Uout of the switching amplifier 300 is equal to Vdc, and the CM voltage Ucm is equal to V0+0.5Vdc.

During a fifth switching interval T5 within a switching period of the desired mode, the control device 10 controls the eight switches S1a, S2a, S1b, S2b, S1c, S2c, S1d, S2d using the sixth vector 6. As shown in FIG. 6, the output voltage Uout of the switching amplifier 300 is equal to 2Vdc, and the CM voltage Ucm is equal to V0+0.5Vdc.

During a sixth switching interval T6 within a switching period of the desired mode, the control device 10 controls the eight switches S1a, S2a, S1b, S2b, S1c, S2c, S1d, S2d using the fifth vector 5. As shown in FIG. 6, the output voltage Uout of the switching amplifier 300 is equal to Vdc, and the CM voltage Ucm is equal to V0+0.5Vdc. Because the change of the CM voltage Ucm is equal to zero during the desired mode, the EMI generated by the CM voltage is greatly reduced.

Figure 7:
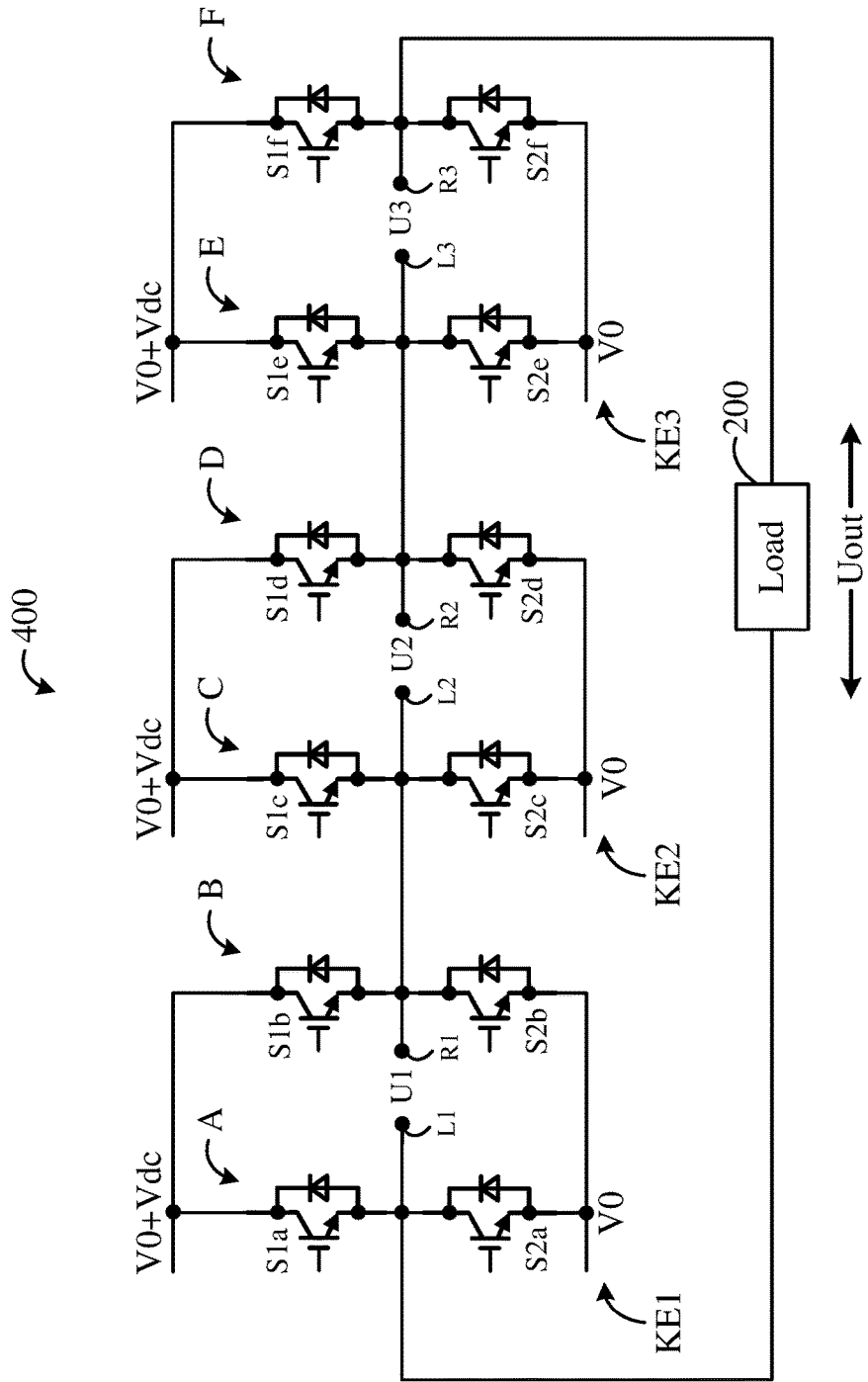
FIG. 7 is a simplified representation of FIG. 1 for the switching amplifier with three cascade elements.

Referring to FIG. 7, a switching amplifier 400 with three cascade elements according to FIG. 1 is depicted. As a non-limiting example, the switching amplifier 400 includes three cascade elements KE1, KE2, KE3.

The difference between the switching amplifier 400 of FIG. 7 and the switching amplifier 300 of FIG. 2 is that the switching amplifier 400 further includes the cascade element KE3. The cascade element KE3 includes two leg circuits E, F.

Two switches of the leg circuit E are labeled as S1e and S2e respectively, two switches of the leg circuit F are labeled as S1f and S2f respectively.

Similar to FIG. 2, twelve switches S1a, S2a, S1b, S2b, S1c, S2c, S1d, S2d, S1e, S2e, S1f, and S2f are controlled by using one of twenty vectors described in Table 2 as shown below, such that the change of the CM voltage generated by the switching amplifier 400 is in the predetermined range and a voltage across the load 200 is in a range from −3Vdc to 3Vdc.

The following Table 2 explains which switches are in the open position and the closed position to achieve space vector modulation.

TABLE 2

Voltage Vector Table

| No | S1a | S2a | S1b | S2b | S1c | S2c | S1d | S2d | S1e | S2e | S1f | S2f | Ucm |
|---|---|---|---|---|---|---|---|---|---|---|---|---|---|
| 1 | ON | off | off | ON | off | ON | ON | off | off | ON | off | ON | 2 Vdc/3 + V0 |
| 2 | ON | off | ON | off | ON | off | ON | off | ON | off | off | ON | Vdc/3 + V0 |
| 3 | off | ON | off | ON | ON | off | off | ON | off | ON | ON | off | 2 Vdc/3 + V0 |
| 4 | off | ON | ON | off | ON | off | off | ON | ON | off | ON | off | Vdc/3 + V0 |
| 5 | ON | off | off | ON | off | ON | off | ON | off | ON | off | ON | Vdc/2 + V0 |
| 6 | ON | off | off | ON | ON | off | ON | off | off | ON | off | ON | Vdc/2 + V0 |
| 7 | ON | off | ON | off | off | ON | off | ON | off | ON | off | ON | Vdc/2 + V0 |
| 8 | ON | off | ON | off | off | ON | off | ON | off | ON | off | ON | Vdc/2 + V0 |
| 9 | off | ON | off | ON | ON | off | off | ON | ON | off | ON | off | Vdc/2 + V0 |
| 10 | ON | off | off | ON | ON | off | off | ON | off | ON | off | ON | Vdc/3 + V0 |
| 11 | ON | off | ON | off | ON | off | off | ON | off | ON | off | ON | 2 Vdc/3 + V0 |
| 12 | ON | off | off | ON | ON | off | off | ON | ON | off | off | ON | Vdc/2 + V0 |
| 13 | ON | off | ON | off | off | ON | ON | off | off | ON | off | ON | Vdc/2 + V0 |
| 14 | off | ON | off | ON | off | ON | off | ON | off | ON | ON | off | Vdc/2 + V0 |
| 15 | off | ON | off | ON | ON | off | ON | off | off | ON | ON | off | Vdc/2 + V0 |
| 16 | off | ON | ON | off | ON | off | off | ON | off | ON | ON | off | Vdc/2 + V0 |
| 17 | off | ON | ON | off | ON | off | off | ON | off | ON | ON | off | Vdc/2 + V0 |
| 18 | off | ON | off | ON | off | ON | ON | off | off | ON | ON | off | Vdc/3 + V0 |
| 19 | off | ON | ON | off | off | ON | ON | off | off | ON | ON | off | 2 Vdc/3 + V0 |
| 20 | off | ON | ON | off | off | ON | ON | off | off | ON | ON | off | Vdc/2 + V0 |

Vector Terminology

Similar to the Table 1, as shown above in the Table 2, the twelve switches S1a, S2a, S1b, S2b, S1c, S2c, S1d, S2d, S1e, S2e, S1f, and S2f are controlled by using one of a first vector 1 and a third vector 3, such that the CM voltage is equal to 2Vdc/3+V0 and the voltage Uout across the load 200 is equal to zero.

The twelve switches S1a, S2a, S1b, S2b, S1c, S2c, S1d, S2d, S1e, S2e, S1f, and S2f are controlled by using one of a second vector 2 and a fourth vector 4, such that the CM voltage is equal to Vdc/3+V0 and the voltage Uout across the load 200 is equal to zero.

The twelve switches S1a, S2a, S1b, S2b, S1c, S2c, S1d, S2d, S1e, S2e, S1f, and S2f are controlled by using one of a fifth vector 5, a sixth vector 6, a seventh vector 7, an eighth vector 8, and a ninth vector 9, such that the CM voltage is equal to Vdc/2+V0 and the voltage Uout across the load 200 is equal to Vdc.

The twelve switches S1a, S2a, S1b, S2b, S1c, S2c, S1d, S2d, S1e, S2e, S1f, and S2f are controlled by using a tenth vector 10, such that the CM voltage is equal to Vdc/3+V0 and the voltage Uout across the load 200 is equal to 2Vdc.

The twelve switches S1a, S2a, S1b, S2b, S1c, S2c, S1d, S2d, S1e, S2e, S1f, and S2f are controlled by using an eleventh vector 11, such that the CM voltage is equal to 2Vdc/3+V0 and the voltage Uout across the load 200 is equal to 2Vdc.

The twelve switches S1a, S2a, S1b, S2b, S1c, S2c, S1d, S2d, S1e, S2e, S1f, and S2f are controlled by using a twelfth vector 12, such that the CM voltage is equal to Vdc/2+V0 and the voltage Uout across the load 200 is equal to 3Vdc.

The twelve switches S1a, S2a, S1b, S2b, S1c, S2c, S1d, S2d, S1e, S2e, S1f, and S2f are controlled by using one of a thirteenth vector 13, a fourteenth vector 14, a fifteenth vector 15, a sixteenth vector 16, and a seventeenth vector 17, such that the CM voltage is equal to Vdc/2+V0 and the voltage Uout across the load 200 is equal to −Vdc.

The twelve switches S1a, S2a, S1b, S2b, S1c, S2c, S1d, S2d, S1e, S2e, S1f, and S2f are controlled by using an eighteenth vector 18, such that the CM voltage is equal to Vdc/3+V0 and the voltage Uout across the load 200 is equal to −2Vdc.

The twelve switches S1a, S2a, S1b, S2b, S1c, S2c, S1d, S2d, S1e, S2e, S1f, and S2f are controlled by using a nineteenth vector 19, such that the CM voltage is equal to 2Vdc/3+V0 and the voltage Uout across the load 200 is equal to −2Vdc.

The twelve switches S1a, S2a, S1b, S2b, S1c, S2c, S1d, S2d, S1e, S2e, S1f, and S2f are controlled by using a twentieth vector 20, such that the CM voltage is equal to Vdc/2+V0 and the voltage Uout across the load 200 is equal to −3Vdc.

In the embodiment, the CM voltage is calculated by Saber or PLECS.

As a specific example, the twelve switches S1a, S2a, S1b, S2b, S1c, S2c, S1d, S2d, S1e, S2e, S1f, and S2f are controlled by using one of the fifth vector 5, the sixth vector 6, the seventh vector 7, the eighth vector 8, the ninth vector 9, the twelfth vector 12, the thirteenth vector 13, the fourteenth vector 14, the fifteenth vector 15, the sixteenth vector 16, the seventeenth vector 17, and the twentieth vector 20, such that the change of the CM voltage generated by the switching amplifier 400 is equal to zero, therefore EMI generated by the CM voltage is greatly reduced.

Figure 8:
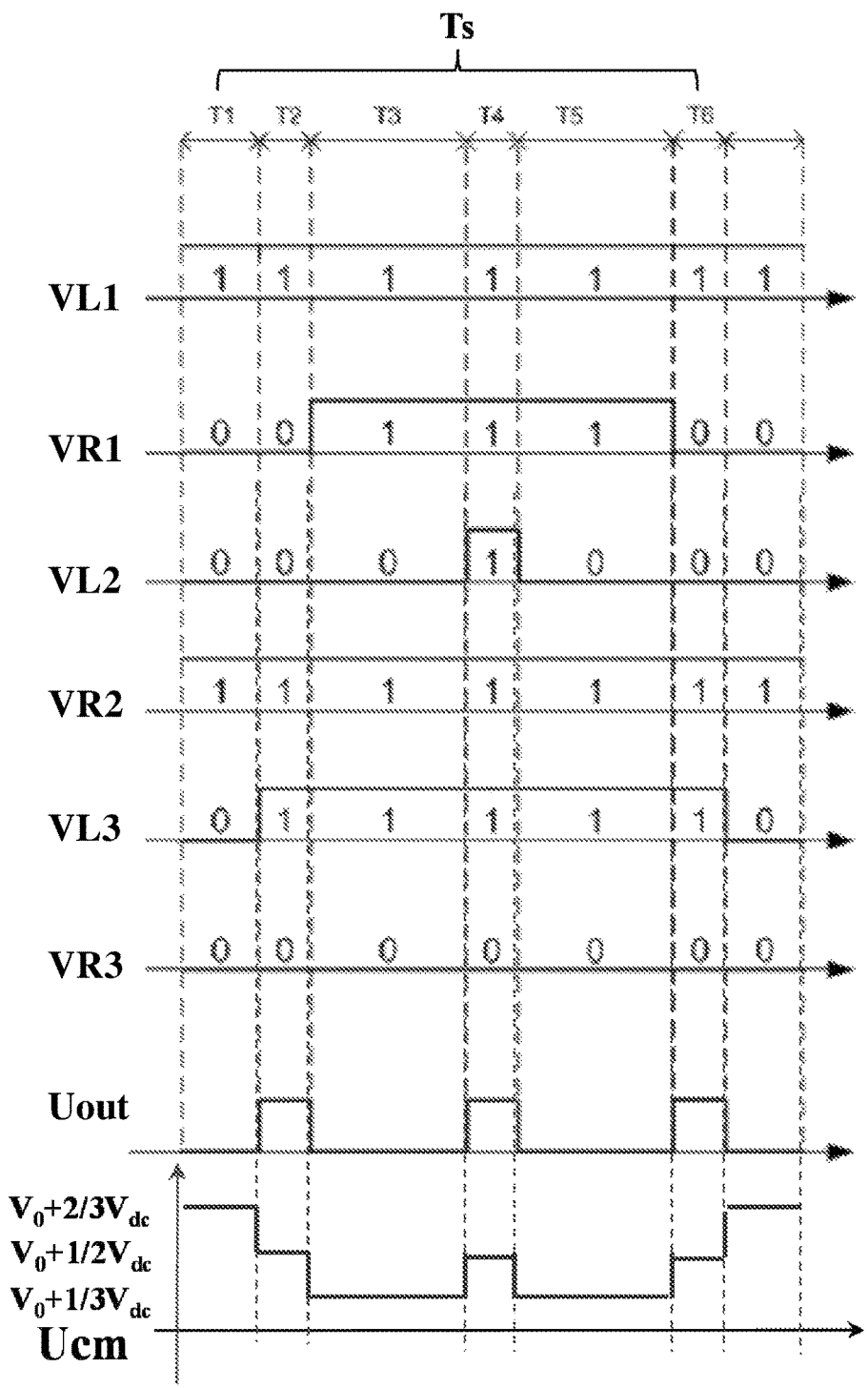
FIG. 8 shows first voltage curves for the switching amplifier of FIG. 7.

In one embodiment, during a first switching interval T1 within a switching period Ts, the control device 10 controls the twelve switches S1a, S2a, S1b, S2b, S1c, S2c, S1d, S2d, S1e, S2e, S1f, S2f using the first vector 1. As shown in FIG. 8, the output voltage Uout of the switching amplifier 400 is equal to zero, and the CM voltage Ucm is equal to 2Vdc/3+V0.

During a second switching interval T2 within the switching period Ts, the control device 10 controls the twelve switches S1a, S2a, S1b, S2b, S1c, S2c, S1d, S2d, S1e, S2e, S1f, S2f using the sixth vector 6. As shown in FIG. 8, the output voltage Uout of the switching amplifier 400 is equal to Vdc, and the CM voltage Ucm is equal to Vdc/2+V0.

During a third switching interval T3 within the switching period Ts, the control device 10 controls the twelve switches S1a, S2a, S1b, S2b, S1c, S2c, S1d, S2d, S1e, S2e, S1f, S2f using the second vector 2. As shown in FIG. 8, the output voltage Uout of the switching amplifier 400 is equal to zero, and the CM voltage Ucm is equal to Vdc/3+V0.

During a fourth switching interval T4 within the switching period Ts, the control device 10 controls the twelve switches S1a, S2a, S1b, S2b, S1c, S2c, S1d, S2d, S1e, S2e, S1f, S2f using the eighth vector 8. As shown in FIG. 8, the output voltage Uout of the switching amplifier 400 is equal to Vdc, and the CM voltage Ucm is equal to Vdc/2+V0.

During a fifth switching interval T5 within the switching period Ts, the control device 10 controls the twelve switches S1a, S2a, S1b, S2b, S1c, S2c, S1d, S2d, S1e, S2e, S1f, S2f using the second vector 2. As shown in FIG. 8, the output voltage Uout of the switching amplifier 400 is equal to zero, and the CM voltage Ucm is equal to Vdc/3+V0.

During a sixth switching interval T6 within the switching period Ts, the control device 10 controls the twelve switches S1a, S2a, S1b, S2b, S1c, S2c, S1d, S2d, S1e, S2e, S1f, S2f using the sixth vector 6. As shown in FIG. 8, the output voltage Uout of the switching amplifier 400 is equal to Vdc, and the CM voltage Ucm is equal to Vdc/2+V0. Because the change of the CM voltage Ucm is in the predetermined range from −Vdc/6 to Vdc/6 during the switching period Ts, the EMI generated by the CM voltage is reduced.

Figure 9:
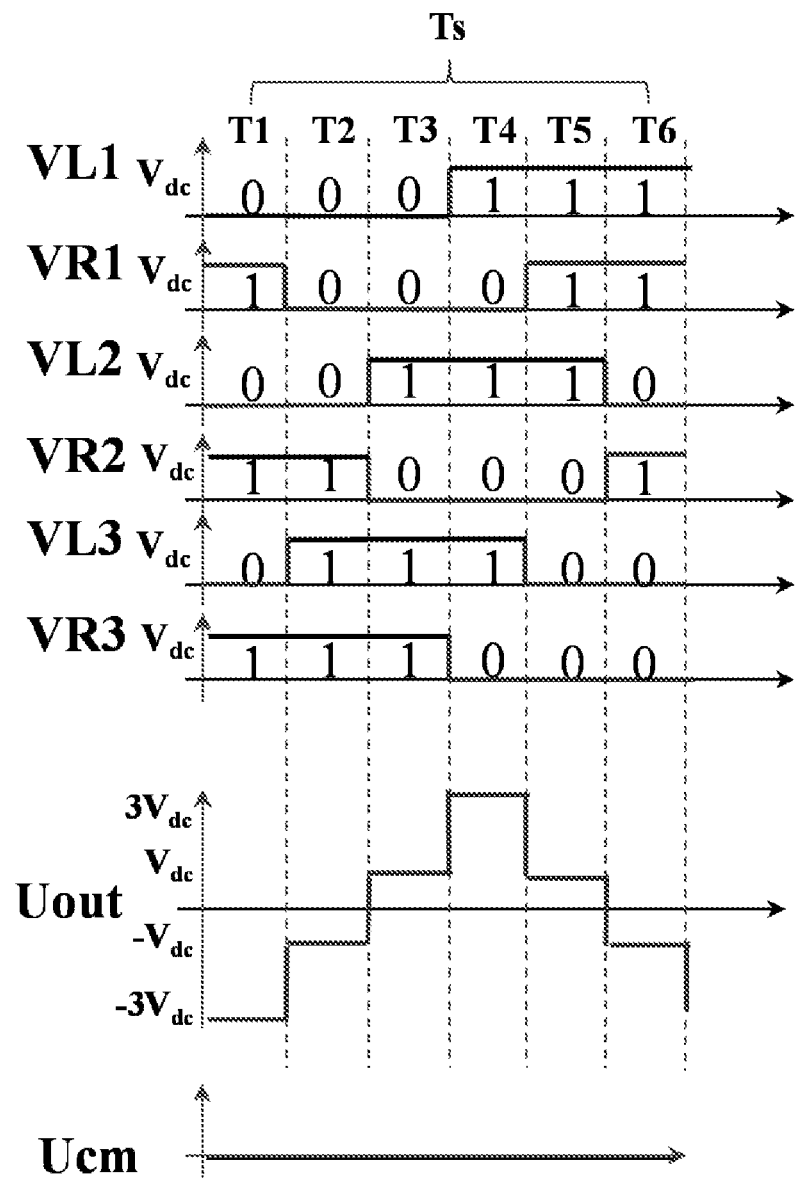
FIG. 9 shows second voltage curves for the switching amplifier of FIG. 7.

In another embodiment, during a first switching interval T1 within a switching period Ts, the control device 10 controls the twelve switches S1a, S2a, S1b, S2b, S1c, S2c, S1d, S2d, S1e, S2e, S1f, S2f using the twentieth vector 20. As shown in FIG. 9, the output voltage Uout of the switching amplifier 400 is equal to −3Vdc, and the CM voltage Ucm is equal to Vdc/2+V0.

During a second switching interval T2 within the switching period Ts, the control device 10 controls the twelve switches S1a, S2a, S1b, S2b, S1c, S2c, S1d, S2d, S1e, S2e, S1f, S2f using the fifteenth vector 15. As shown in FIG. 9, the output voltage Uout of the switching amplifier 400 is equal to −Vdc, and the CM voltage Ucm is equal to Vdc/2+V0.

During a third switching interval T3 within the switching period Ts, the control device 10 controls the twelve switches S1a, S2a, S1b, S2b, S1c, S2c, S1d, S2d, S1e, S2e, S1f, S2f using the ninth vector 9. As shown in FIG. 9, the output voltage Uout of the switching amplifier 400 is equal to Vdc, and the CM voltage Ucm is equal to Vdc/2+V0.

During a fourth switching interval T4 within the switching period Ts, the control device 10 controls the twelve switches S1a, S2a, S1b, S2b, S1c, S2c, S1d, S2d, S1e, S2e, S1f, S2f using the twelfth vector 12. As shown in FIG. 9, the output voltage Uout of the switching amplifier 400 is equal to 3Vdc, and the CM voltage Ucm is equal to Vdc/2+V0.

During a fifth switching interval T5 within the switching period Ts, the control device 10 controls the twelve switches S1a, S2a, S1b, S2b, S1c, S2c, S1d, S2d, S1e, S2e, S1f, S2f using the seventh vector 7. As shown in FIG. 9, the output voltage Uout of the switching amplifier 400 is equal to Vdc, and the CM voltage Ucm is equal to Vdc/2+V0.

During a sixth switching interval T6 within the switching period Ts, the control device 10 controls the twelve switches S1a, S2a, S1b, S2b, S1c, S2c, S1d, S2d, S1e, S2e, S1f, S2f using the thirteenth vector 13. As shown in FIG. 9, the output voltage Uout of the switching amplifier 400 is equal to −Vdc, and the CM voltage Ucm is equal to Vdc/2+V0. Because the change of the CM voltage Ucm is equal to zero during the switching period Ts, the EMI generated by the CM voltage is greatly reduced.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A switching amplifier, comprising:
a plurality of cascade elements coupled in series between two terminals of a load, each of the cascade elements comprising:
a respective direct current (DC) power source; and
two leg circuits, each comprised of switches connected in series between two poles of the respective DC power source; and
a control device coupled to the respective switches in the respective leg circuits in the respective cascade elements; wherein the control device is configured to control all of the switches using space vector modulation (SVM), such that a change of a common mode (CM) voltage generated by the switching amplifier is in a predetermined range.

2. The switching amplifier of claim 1, wherein all of the switches are controlled by using the SVM, such that the change of the CM voltage is equal to zero.

3. The switching amplifier of claim 1, wherein a voltage across the load is in a range from −nVdc to nVdc; where n is a number of the plurality of cascade elements and Vdc is a voltage of the respective DC power source.

4. The switching amplifier of claim 1, wherein each leg circuit consists of two switches connected in series between the two poles of the respective DC power source.

5. The switching amplifier of claim 4, wherein the plurality of cascade elements consist of two cascade elements, eight switches of the switching amplifier are controlled by using one of eight vectors, such that the change of the CM voltage is equal to zero.

6. The switching amplifier of claim 4, wherein the plurality of cascade elements consist of two cascade elements, the eight switches of the switching amplifier are controlled to be in a desired mode or in one of a first mode and a second mode or in one of a first mode, a second mode, a third mode, and a fourth mode according to a ratio of a load output reference voltage to a voltage of the power source, such that the change of the CM voltage is equal to zero.

7. The switching amplifier of claim 4, wherein the plurality of cascade elements consist of two cascade elements, during a first, a second, a third, a fourth, a fifth, and a sixth switching intervals within a switching period, eight switches of the switching amplifier are controlled by using a ninth vector, a tenth vector, a second vector, a fifth vector, a seventh vector, and an eighth vector respectively.

8. The switching amplifier of claim 4, wherein the plurality of cascade elements consist of three cascade elements, twelve switches of the switching amplifier are controlled by using one of twelve vectors, such that the change of the CM voltage is equal to zero.

9. The switching amplifier of claim 4, wherein the plurality of cascade elements consist of three cascade elements, during a first, a second, a third, a fourth, a fifth, and a sixth switching intervals within a switching period, twelve switches of the switching amplifier are controlled by using a first vector, a sixth vector, a second vector, an eighth vector, the second vector, and the sixth vector respectively.

10. A method for operating a switching amplifier, the switching amplifier comprising a plurality of cascade elements, the method comprising:
 coupling the plurality of cascade elements in series between two terminals of a load;
 providing a respective DC power source in each of the cascade elements;
 providing two leg circuits in each of the cascade elements, each leg circuit comprised of switches connected in series between two poles of the respective DC power source; and
 controlling all of the switches comprised in the switching amplifier using space vector modulation (SVM), such that a change of a common mode (CM) voltage generated by the switching amplifier is in a predetermined range.

11. The method of claim 10, further comprising:
 controlling all of the switches using the SVM, such that the change of the CM voltage is equal to zero.

12. The method of claim 10, further comprising:
 controlling all of the switches using the SVM, such that a voltage across the load is in a range from −nVdc to nVdc; where n is a number of the plurality of cascade elements and Vdc is a voltage of the respective DC power source.

13. The method of claim 10, further comprising:
 providing two switches in each leg circuit.

14. The method of claim 13, wherein the plurality of cascade elements consist of two cascade elements, the step of controlling all of the switches comprises the step of:
 controlling eight switches of the switching amplifier using one of eight vectors, such that the change of the CM voltage is equal to zero.

15. The method of claim 13, wherein the plurality of cascade elements consist of two cascade elements, the step of controlling all of the switches comprises the step of:
 controlling eight switches of the switching amplifier to be in one of a first mode, a second mode, a third mode, and a fourth mode or in one of a first mode and a second mode or in a desired mode according to a ratio of a load output reference voltage to a voltage of the power source, such that the change of the CM voltage is equal to zero.

16. The method of claim 13, wherein the plurality of cascade elements consist of two cascade elements, the step of controlling all of the switches comprises the step of:
 during a first, a second, a third, a fourth, a fifth, and a sixth switching intervals within a switching period, controlling eight switches of the switching amplifier using a ninth vector, a tenth vector, a second vector, a fifth vector, a seventh vector, and an eighth vector respectively.

17. The method of claim 13, wherein the plurality of cascade elements consist of three cascade elements, the step of controlling all of the switches comprises the step of:
 controlling twelve switches of the switching amplifier using one of twelve vectors, such that the change of the CM voltage is equal to zero.

18. The method of claim 13, wherein the plurality of cascade elements consist of three cascade elements, the step of controlling all of the switches comprises the step of:
 during a first, a second, a third, a fourth, a fifth, and a sixth switching intervals within a switching period, controlling twelve switches of the switching amplifier using a first vector, a sixth vector, a second vector, an eighth vector, the second vector, and the sixth vector respectively.

19. A gradient amplifier, comprising:
 a plurality of cascade elements coupled in series between two terminals of a gradient coil, each of the cascade elements comprising:
  a respective DC power source; and
  two leg circuits, each comprised of switches connected in series between two poles of the respective DC power source; and
 a control device coupled to the respective switches in the respective leg circuits in the respective cascade elements; wherein the control device is configured to control all of the switches using space vector modulation (SVM), such that a change of a common mode (CM) voltage generated by the gradient amplifier is in a predetermined range.

20. The gradient amplifier of claim 19, wherein all of the switches are controlled by using the SVM, such that the change of the CM voltage is equal to zero.

* * * * *